(12) United States Patent
Kim

(10) Patent No.: US 9,331,877 B2
(45) Date of Patent: May 3, 2016

(54) RECEIVER OF SEMICONDUCTOR APPARATUS AND SEMICONDUCTOR SYSTEM INCLUDING THE SAME

(71) Applicant: SK hynix Inc., Icheon-si Gyeonggi-do (KR)

(72) Inventor: Ji Hwan Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/329,533

(22) Filed: Jul. 11, 2014

(65) Prior Publication Data
US 2015/0270995 A1    Sep. 24, 2015

(30) Foreign Application Priority Data
Mar. 19, 2014    (KR) .......................... 10-2014-0032042

(51) Int. Cl.
*G11C 7/10*    (2006.01)
*H04L 27/06*    (2006.01)
*H04B 1/24*    (2006.01)

(52) U.S. Cl.
CPC .............. *H04L 27/06* (2013.01); *G11C 7/1084* (2013.01); *H04B 1/24* (2013.01)

(58) Field of Classification Search
CPC ........ H04B 1/24; H04B 27/06; G11C 7/1051; G11C 7/1057; G11C 7/1078; G11C 7/1084; H03K 19/00; H03K 19/0013; H03K 19/09429
USPC .................................................. 365/189.05
See application file for complete search history.

(56) References Cited

U.S. PATENT DOCUMENTS

| 7,643,364 | B2 * | 1/2010 | Lee | .......................... G11C 7/08 365/189.05 |
| 2005/0168246 | A1 * | 8/2005 | Sharma | .......... H03K 19/018585 327/78 |
| 2007/0046332 | A1 * | 3/2007 | Tanaka | ................ H04L 25/0272 326/83 |
| 2009/0066372 | A1 * | 3/2009 | La Placa | .............. G11C 7/1051 327/108 |

FOREIGN PATENT DOCUMENTS

KR    1020070069363 A    7/2007

* cited by examiner

*Primary Examiner* — David B. Lugo
(74) *Attorney, Agent, or Firm* — William Park & Associates Ltd.

(57) ABSTRACT

A receiver of a semiconductor apparatus includes a first buffer unit configured to buffer a first positive input signal and a first negative input signal having a phase opposite the phase of the first positive input signal and to output the buffered first positive input signal as a first positive transmission signal and to output the buffered first negative input signal as a first negative transmission signal in response to a first enable signal, a second buffer unit configured to buffer a second positive input signal and a second negative input signal having a phase opposite the phase of the second positive input signal and to output the buffered second positive input signal as a second positive transmission signal and to output the buffered second negative input signal as a second negative transmission signal in response to a second enable signal, is and an output unit configured to invert one of the first and second positive transmission signals and to output the inverted one of the first and second positive transmission signals as a positive output signal, and to invert one of the first and second negative transmission signals and to output the inverted one of the first and second negative transmission signals as a negative output signal.

15 Claims, 5 Drawing Sheets

RECEIVER OF SEMICONDUCTOR APPARATUS AND SEMICONDUCTOR SYSTEM INCLUDING THE SAME

CROSS-REFERENCES TO RELATED APPLICATION

The present application claims priority under 35 U.S.C. §119(a) to Korean application number 10-2014-0032042, filed on Mar. 19, 2014, in the Korean Intellectual Property Office, which is incorporated herein by reference in its entirety.

BACKGROUND

1. Technical Field

Various embodiments relate to a semiconductor apparatus, and more particularly, to a receiver of a semiconductor apparatus.

2. Related Art

In general, a semiconductor apparatus may include a signal is transmission unit and a signal processing unit. The signal transmission unit receives a signal from an external device that is external to the semiconductor apparatus and transmits the received signal to a signal processing unit. The signal processing unit processes the signal received from the signal transmission unit in accordance with an intrinsic predetermined operation.

The signal transmission unit may include an input circuit for transmitting the signal received from the external device to the signal processing unit. The signal transmission unit may include an output circuit for transmitting the data received from the signal processing unit to the external device. Examples of the signal that the input circuit may receive from the external device may include, but are not limited to, an address signal, a clock signal and a data signal. The input circuit may transmit the received signal to a circuit disposed within the the semiconductor apparatus. The output circuit may output data corresponding to an address signal received from the external device.

The signal processing unit may be referred to as a core circuit of the semiconductor apparatus. The core circuit may receive various control signals from the signal transmission unit and may to perform predetermined operations.

SUMMARY

In an embodiment, a receiver of a semiconductor apparatus may include a first buffer unit configured to buffer a first positive input signal and a first negative input signal having a phase opposite the phase of the first positive input signal and to output the buffered first positive input signal as a first positive transmission signal and to output the buffered first negative input signal as a first negative transmission signal in response to a first enable signal, a second buffer unit configured to buffer a second positive input signal and a second negative input signal having a phase opposite the phase of the second positive input signal and to output the buffered second positive input signal as a second positive transmission signal and to output the buffered second negative input signal as a second negative transmission signal in response to a second enable signal, and an output unit configured to invert one of the first and second positive transmission signals and to output the inverted one of the first and second positive transmission signals as a positive output signal, and to invert one of the first and second negative transmission signals and to output the inverted one of the first and second negative transmission signals as a negative output signal.

In an embodiment, a receiver of a semiconductor apparatus may include a first buffer unit configured to buffer a first input signal and to output a first positive transmission signal and a first negative transmission signal having a phase opposite the phase of the first positive transmission signal in response to a first enable signal, a second buffer unit configured to buffer a second input signal and to output a second positive transmission signal and a second negative transmission signal having a phase opposite the phase of the second is positive transmission signal in response to a second enable signal and an output unit configured to invert one of the first and second positive transmission signals and to output the inverted one of the first and second positive transmission signals as a positive output signal, and to invert one of the first and second negative transmission signals and to output the inverted one of the first and second negative transmission signals as a negative output signal.

In an embodiment, a receiver of a semiconductor apparatus may include a first buffer unit configured to buffer a first positive input signal and a first negative input signal having a phase opposite the phase of the first positive input signal and to output the buffered first positive input signal as a first positive transmission signal and to output the buffered first negative input signal as a first negative transmission signal in response to a first enable signal, a second buffer unit configured to buffer a second input signal and to output a second positive transmission signal and a second negative transmission signal having a phase opposite the phase of the second positive transmission signal in response to a second enable signal, and an output unit configured to invert one of the first and second positive transmission signals and to output the inverted one of the first and second positive transmission signals as a positive output signal, and to invert one of the first and second negative transmission signals and to output the inverted one of the first and second negative transmission signals as a negative output signal.

In an embodiment, a semiconductor system may include a is memory chip including a receiver and a controller configured to control the memory chip in response to an external request, wherein the memory chip is configured to receive a second input signal in a floating state when receiving a first input signal from an external device, and is configured to receive the first input signal in a floating state when receiving the second input signal from the controller, the receiver including a first buffer unit configured to buffer the first input signal and to output the buffered first input signal as a first transmission signal in response to a first enable signal, a second buffer unit configured to buffer the second input signal and to output the buffered second input signal as a second transmission signal in response to a second enable signal, and an output unit configured to invert one of the first and second transmission signals and to output the inverted one of the first and second transmission signals as an output signal.

DETAILED DESCRIPTION

Hereinafter, a receiver of a semiconductor apparatus and a semiconductor system including the same will be described below with reference to the accompanying drawings through various embodiments.

Figure 1:
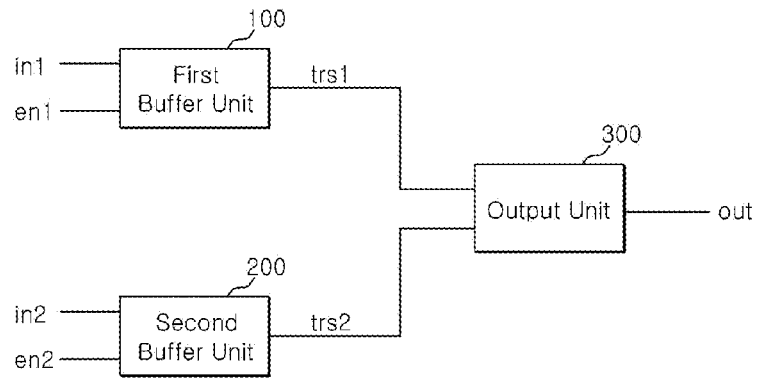
FIG. 1 is a block diagram representation of an embodiment of a receiver of a semiconductor apparatus.

FIG. 1 is a block diagram representation of an embodiment of a receiver 10 of a semiconductor apparatus.

The receiver 10 may receive two signals, a first input signal in1 and a second input signal in2, are received under different circumstances. The receiver 10 may buffer the first and second input signals in1, in2 and may output an output signal out. The buffering of one of the input signals in1, in2 may not impact the buffering of the other input signal in1, in2. For example, the receiver 10 may output the first input signal in1 as the output signal out when a first enable signal en1 is enabled. The receiver 10 may output the second input signal in2 as the output signal out when a second enable signal en2 is enabled.

The receiver 10 may include a first buffer unit 100, a second buffer unit 200 and an output unit 300. The first buffer unit 100 buffers the first input signal in1 to a CMOS level in response to the first enable signal en1 and outputs the buffered first input signal as a first transmission signal trs1. The second buffer unit 200 buffers the second input signal in2 to a CMOS level in response to the second enable signal en2 and outputs the buffered second input signal as a second transmission signal trs2. The output unit 300 outputs one of the first and second transmission signals trs1, trs2 as the output signal out.

The first buffer unit 100 may output the buffered first input signal as the first transmission signal trs1 when the first enable signal en1 is enabled. The first buffer unit 100 may output the first transmission signal trs1 at a first logic level when the first enable signal en1 is disabled.

The second buffer unit 200 may output the buffered second input signal as the second transmission signal trs2 when the second enable signal en2 is enabled. The second buffer unit 200 may output the second transmission signal trs2 at the first logic level when the second enable signal en2 is disabled.

When one of the first and second transmission signals trs1, trs2 is at the first logic level, the output unit 300 may output the other one of the first and second transmission signals trs1, trs2 as the output signal out.

While FIG. 1 shows the receiver 10 as having two buffer units 100, 200, alternative embodiments of the receiver may include is three or more buffer units. Each of the plurality of buffer units may receive an input signal and a corresponding enable signal. An output unit may output any one of the transmission signals received from the plurality of buffer units as an output signal.

Figure 2:
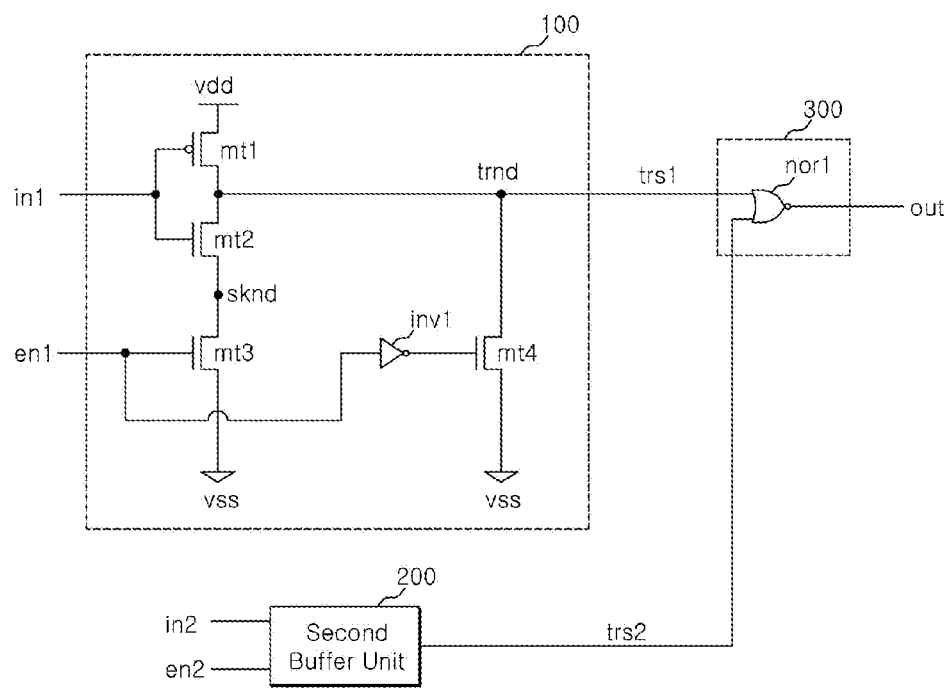
FIG. 2 is a circuit diagram representation of an embodiment to of the receiver shown in FIG. 1.

FIG. 2 is a circuit diagram representation of an embodiment of the receiver 10 shown in FIG. 1. The first buffer unit 100 and the second buffer unit 200 may be configured in substantially the same manner.

The first buffer unit 100 may include first, second, third, and fourth transistors mt1, mt2, mt3, mt4 and a first inverter inv1. The first transistor mt1 may form a current path between the source and the drain of the first transistor mt1. The first transistor mt1 may form a current path between the terminal of a power supply voltage vdd and a transmission node trnd.

The first input signal in1 may be received at the gate of the first transistor mt1. The second transistor mt2 may form a current path between the source and the drain of the second transistor mt2. The second transistor mt2 may form a current path between a sinking node sknd and the transmission node trnd. The first input signal in1 may be received at the gate of the second transistor mt2. The third transistor mt3 may form a current path between the source and the drain of the third transistor mt3. The third transistor mt3 may form a current path between the terminal of a ground voltage vss and the sinking node sknd. The first enable signal en1 may be received at the gate of the third transistor mt3. The first inverter inv1 may receive the first enable signal en1. is The fourth transistor mt4 may form a current path between the source and the drain of the fourth transistor mt4. The fourth transistor mt4 may form a current path between the terminal of the ground voltage vss and the transmission node trnd. The output of the first inverter inv1 may be received at the gate of the fourth transistor mt4. The first transmission signal trs1 may be output via the transmission node trnd.

The output unit 300 may include a NOR gate nor1. The NOR gate nor1 may receive the first and second transmission signals trs1, trs2 as inputs. The NOR gate nor1 may generate the output signal out based on the performance of a NOR operation on the first and second transmission signals trs1, trs2.

The operation of the receiver 10 will be described with reference to FIGS. 1 and 2. In the description of the operation of the receiver 100, an assumption is made that the first and second enable signals en1 and en2 may be enabled to, for example, a logic high.

When the first enable signal en1 is enabled, the first buffer unit 100 may operate as follows. The fourth transistor mt4 may be turned off. The third transistor mt3 may be turned on, and the sinking node sknd may be sunk. The first transistor mt1 or the second transistor mt2 may be turned on based on the voltage level of the first input signal in1. The transmission node trnd may be driven to the external voltage vdd by the first transistor mt1 or to the ground voltage vss by the second transistor mt2. The first transmission signal trs1 output from the transmission node trnd may is be generated at a voltage level that swings between the external voltage vdd and the ground voltage vss based on the first input signal in1, wherein the first input signal in1 is at the CMOS level. The first buffer unit 100 may buffer the first input signal in1 to the CMOS level, perform an inversion of the first input signal in1 and output the inverted first input signal as the first transmission signal trs1 when the first enable signal en1 is enabled.

When the first enable signal en1 is disabled, the first buffer unit 100 may operate as follows. The third transistor mt3 may be turned off, and the sinking node sknd may not be sunk. The fourth transistor mt4 may be turned on. The transmission node trnd may be driven to the ground voltage vss by the fourth transistor mt4. The first transmission signal trs1 output from the transmission node trnd may be generated at the level of the ground voltage vss at the first logic level. The first buffer unit 100 may output the first transmission signal trs1 at the first logic level when the first enable signal en1 is disabled.

The second buffer unit 200 may operate in substantially the same manner as the first buffer unit 100.

When any one of the received first and second transmission signals trs1, trs2 has the level of the ground voltage vss, the NOR gate nor1 may invert the other one of the first and second transmission signals trs1, trs2 and generate the output signal out. For example, the NOR gate nor1 may receive the first transmission signal trs1 which swings at the CMOS level and the second is transmission signal trs2 at the level of the ground voltage vss, when the first enable signal en1 is enabled and the second enable signal en2 is disabled. The NOR gate nor1 may invert the first transmission signal trs1 and output the inverted first transmission signal as the output signal out.

The receiver 10 may output the first input signal in1 of the received first and second input signals in1, in2 as the output signal out, for example, when the first enable signal en1 is enabled and the second enable signal en2 is disabled.

In another example, the receiver 10 may output the second input signal in2 of the received first and second input signals in1, in2 as the output signal out, for example, when the first enable signal en1 is disabled and the second enable signal en2 is enabled.

Figure 3:
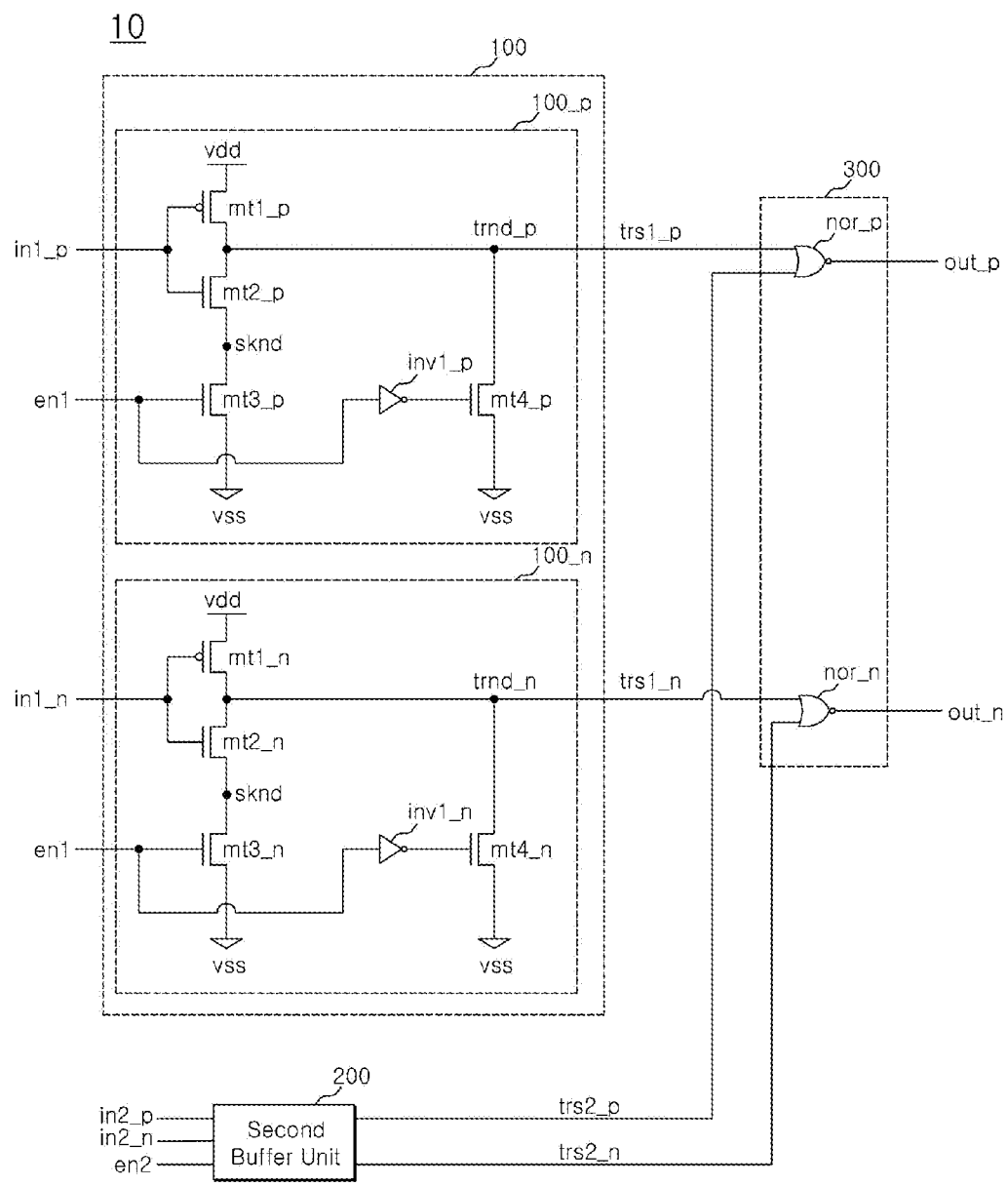
FIG. 3 is a circuit diagram representation of an embodiment of the receiver shown in FIG. 1.

FIG. 3 is a circuit diagram representation of an embodiment of the receiver 10 shown in FIG. 1. The receiver 10 may operate in a differential scheme, unlike the receiver 10 shown in FIG. 2.

The first buffer unit 100 may receive a first positive input signal in1_p and a first negative input signal in1_n as a first input signal (corresponding to the first input signal in1 of FIG. 1). The first positive input signal in1_p and the first negative input signal in1_n may have opposite phases. The first buffer unit 100 may output a first positive transmission signal trs1_p and a first negative transmission signal trs1_n as a first transmission signal (corresponding to the first transmission signal trs1 of FIG. 1).

The first buffer unit 100 may include a positive buffer section 100_p and a negative buffer section 100_n. The positive buffer section 100_p may invert the first positive input signal in1_p and output the inverted first positive input signal as the first positive transmission signal trs1_p, in response to the first enable signal en1. The negative buffer section 100_n may invert the first negative input signal in1_n and output the inverted first negative input signal as the first negative transmission signal trs1_n, in response to the first enable signal en1.

The configuration and the operating method of the positive buffer section 100_p and the negative buffer section 100_n may be substantially similar to the configuration and the operating method of the first buffer unit 100 shown in FIG. 2.

The second buffer unit 200 may receive a second positive input signal in2_p and a second negative input signal in2_n as a second input signal (corresponding to the second input signal in2 of FIG. 1). The second positive input signal in2_p and the second negative input signal in2_n may have opposite phases. The second buffer unit 200 may output a second positive transmission signal trs2_p and a second negative transmission signal trs2_n as a second transmission signal (corresponding to the second transmission signal trs2 of FIG. 1). The configuration and the operating method of the second buffer unit 200 may be substantially similar to the configuration and the operating method of the first buffer unit 100.

The output unit 300 may output a positive output signal out_p and a negative output signal out_n as an output signal (corresponding to the output signal out of FIG. 1). The output unit 300 may include a positive NOR gate nor_p and a negative NOR gate nor_n. The positive NOR gate nor_p may receive the first and second positive transmission signals trs1_p, trs2_p. The positive NOR gate nor_p may output the positive output signal out_p, based on the performance of a NOR operation on the first and second positive transmission signals trs1_p, trs2_p. The negative NOR gate nor_n may receive the first and second negative transmission signals trs1_n, trs2_n. The negative NOR gate nor_n may output the negative output signal out_n, based on the performance of a NOR operation on the first and second negative transmission signals trs1_n, trs2_n.

When the first enable signal en1 is enabled and the second enable signal en2 is disabled, the receiver 10 shown in FIG. 3 may operate as follows.

The positive buffer section 100_p may buffer the first positive input signal in1_p to a CMOS level, perform an inversion of the first positive input signal in1_p and output the inverted first positive input signal as the first positive transmission signal trs1_p in response to the enabled first enable signal en1. The negative buffer section 100_n may buffer the first negative input signal in1_n to a CMOS level, perform an inversion of the first negative input signal in1_n and output the inverted first negative input signal as the first negative transmission signal trs1_n in response to the enable first enable signal en1.

The second buffer unit 200 may output the second positive is transmission signal trs2_p and the second negative transmission signal trs2_n having the level of a ground voltage vss, in response to the disabled second enable signal en2.

The positive NOR gate nor_p may receive the first positive transmission signal trs1_p that swings at the CMOS level and the second positive transmission signal trs2_p having the level of the ground voltage vss, and may perform a NOR operation on the the first positive transmission signal trs1_p and the second positive transmission signal trs2_p. The positive NOR gate nor_p may invert the first positive transmission signal trs1_p and output the inverted first positive transmission signal as the positive output signal out_p.

The negative NOR gate nor_n may receive the first negative transmission signal trs1_n that swings at the CMOS level and the second negative transmission signal trs2_n having the level of the ground voltage vss, and may perform a NOR operation on the first negative transmission signal trs1_n and the second negative transmission signal trs2_n. The negative NOR gate nor_n may invert the first negative transmission signal trs1_n and output the inverted first negative transmission signal as the negative output signal out_n.

When the first enable signal en1 is enabled and the second enable signal en2 is disabled, the receiver 10 may output the first positive input signal in1_p of the received first and second positive input signals in1_p, in2_p as the positive output signal out_p. The receiver 10 may output the first negative input signal in1_n of the received first and second negative input signals in1_n, in2_n as the is negative output signal out_n.

In another example, when the first enable signal en1 is disabled and the second enable signal en2 is enabled, the receiver 10 may output the second positive input signal in2_p of the received first and second positive input signals in1_p and in2_p as the positive output signal out_p. The receiver 10 may output the second negative input signal in2_n of the received first and second negative input signals in1_n and in2_n as the negative output signal out_n.

Figure 4:
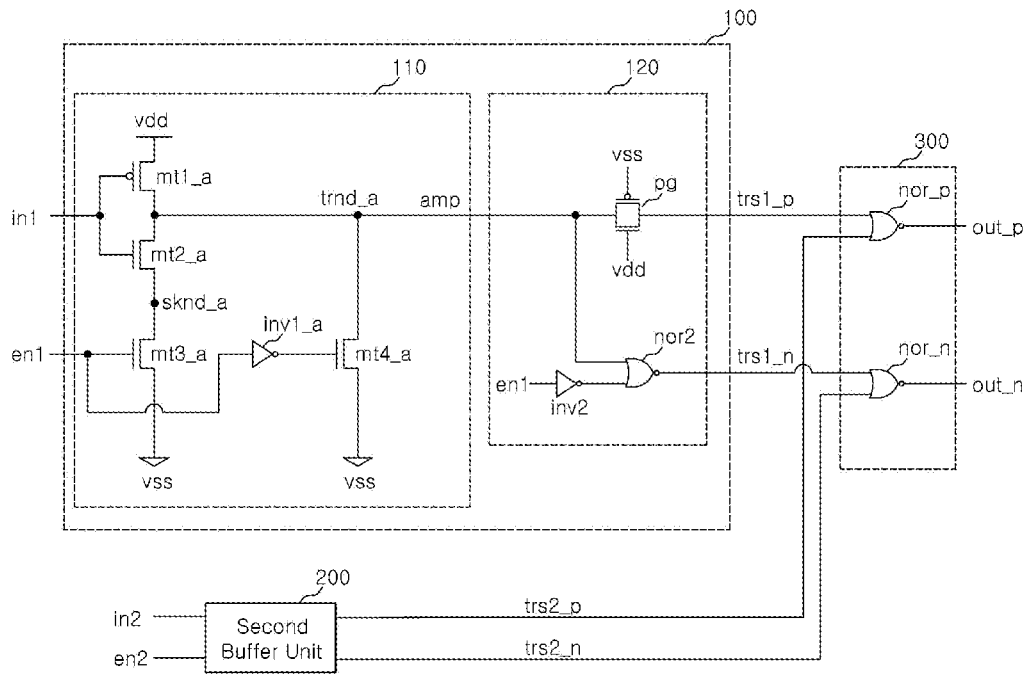
FIG. 4 is a circuit diagram representation of an embodiment of the receiver shown in FIG. 1.

FIG. 4 is a circuit diagram representation of an embodiment of the receiver 10 shown in FIG. 1. The receiver 10 may receive first and second input signals in1, in2 in a single-ended scheme, and may output positive and negative output signals out_p, out_n in a differential scheme.

The first buffer unit 100 shown in FIG. 4 may receive the first input signal in1 and may output a first positive transmission signal trs1_p and a first negative transmission signal trs1_n as a first transmission signal (corresponding to the first transmission signal trs1 of FIG. 1). The first positive transmission signal trs1_p and the first negative transmission signal trs1_n may have opposite phases.

The first buffer unit 100 may include an amplifying section 110 and a dividing section 120.

The amplifying section 110 may invert the first input signal in1 and output the inverted first input signal as an amplified signal amp in response to the first enable signal en1. The dividing section 120 may divide the amplified signal amp and output the first positive is transmission signal trs1_p and the first negative transmission signal trs1_n in response to the first enable signal en1.

The configuration and the operating method of the amplifying section 110 may be substantially similar to the configuration and the operating method of the first buffer unit 100 shown in FIG. 2. The amplifying section 110 may output the amplified signal amp in substantially the same manner as the the first buffer unit 100 shown in FIG. 2 outputs the first transmission signal trs1 (see FIG. 2).

The dividing section 120 may include a pass gate pg, a second inverter inv2, and a NOR gate nor2.

The pass gate pg may be applied with a power supply voltage vdd and a ground voltage vss and output the amplified signal amp as the first positive transmission signal trs1_p. The second inverter inv2 may receive the first enable signal en1. The NOR gate nor2 may receive the amplified signal amp and the output of the second inverter inv2. The NOR gate nor2 may output the first negative transmission signal trs1_n, based on the performance of a NOR operation on the amplified signal amp and the output of the second inverter inv2.

The second buffer unit 200 may receive the second input signal in2 and may output a second positive transmission signal trs2_p and a second negative transmission signal trs2_n as a second transmission signal (corresponding to the second transmission signal trs2 of FIG. 1). The configuration and the operating method of the second buffer unit 200 may be substantially similar to the configuration and the operating method of the first buffer unit 100.

The configuration and the operating method of the output unit 300 may be substantially similar to the configuration and the operating method of the output unit 300 shown in FIG. 3.

When the first enable signal en1 is enabled, the first buffer unit 100 shown in FIG. 4 may operate as follows. The amplifying section 110 may buffer the first input signal in1 to a CMOS level, perform an inversion of the first input signal in1, and output the inverted first input signal as the amplified signal amp. The pass gate pg may output the amplified signal amp that swings at the CMOS level as the first positive transmission signal trs1_p. The NOR gate nor2 may receive the amplified signal amp that swings at the CMOS level and the output of the second inverter inv2 having a logic low level, and may perform a NOR operation on the amplified signal amp and the output of the second inverter inv2. The NOR gate nor2 may invert the amplified signal amp and output the inverted amplified signal as the first negative transmission signal trs1_n. The first buffer unit 100 may buffer the first input signal in1 to the CMOS level and output the first positive transmission signal trs1_p and the first to negative transmission signal trs1_n having opposite phases in response to the enable first enable signal en1.

When the first enable signal en1 is disabled, the first buffer unit 100 may operate as follows. The amplifying section 110 may output the amplified signal amp having the level of the ground voltage vss. The pass gate pg may output the amplified signal amp having the level of the ground voltage vss as the first positive transmission signal trs1_p. The NOR gate nor2 may receive the amplified signal amp having the level of the ground voltage vss and the output of the second inverter inv2 having a logic high level, and may perform a NOR operation on the amplified signal amp and the output of the second inverter inv2. The NOR gate nor2 may output the first negative transmission signal trs1_n having the level of the ground voltage vss. The first buffer unit 100 may output the first positive transmission signal trs1_p and the first negative transmission signal trs1_n having the level of the ground voltage vss in response to the disabled first enable signal en1.

The receiver 10 may output the first input signal in1 of the received first and second input signals in1, in2 as the positive output signal out_p and the negative output signal out_n, when the first enable signal en1 is enabled and the second enable signal en2 is disabled.

In another example, the receiver 10 may output the second input signal in2 of the received first and second input signals in1, in2 as the positive output signal out_p and the negative output signal out_n, when the first enable signal en1 is disabled and the second enable signal en2 is enabled.

Figure 5:
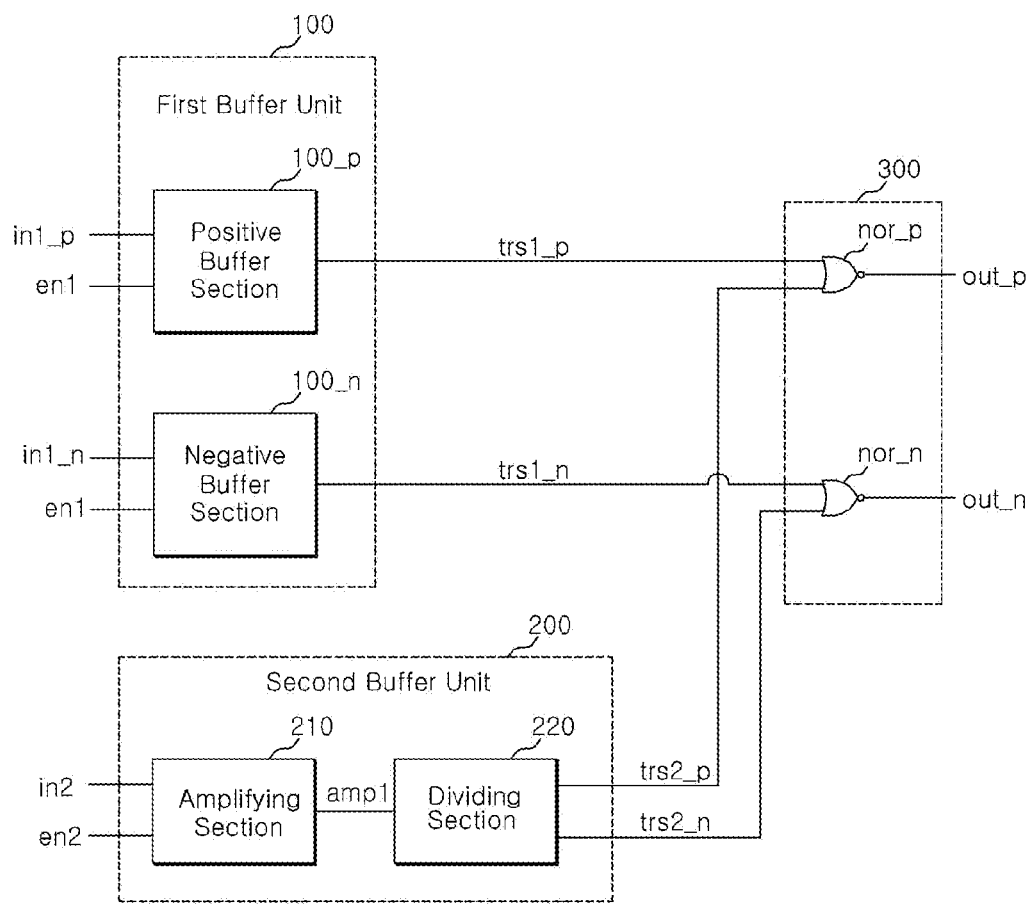
FIG. 5 is a circuit diagram representation of an embodiment of the receiver shown in FIG. 1.

FIG. 5 is a circuit diagram representation of an embodiment of the receiver 10 shown in FIG. 1.

The first buffer unit 100 may receive a first positive input signal in1_p and a first negative input signal in1_n as a first input signal (corresponding to the input signal in1 of FIG. 1) and output a first positive transmission signal trs1_p and a first negative transmission signal trs1_n as a first transmission signal (corresponding to the first transmission signal trs1 of FIG. 1), in a differential scheme. For example, the configuration and the operating method of the first buffer unit 100 may be substantially similar to the configuration and the operating method of the first buffer unit 100 shown in FIG. 3.

The second buffer unit 200 may receive a second input signal in2 in a single-ended scheme and may output a second positive transmission signal trs2_p and a second negative transmission signal trs2_n as a second transmission signal (corresponding to the second transmission signal trs2 of FIG. 1) in a differential scheme. For example, the configuration and the operating method of the second buffer unit 200 may be substantially similar to the configuration and the operating method of the first buffer unit 100 shown in FIG. 4.

The output unit 300 may receive the first positive transmission signal trs1_p and the first negative transmission signal trs1_n as the first transmission signal (corresponding to the first transmission signal trs1 of FIG. 1) and may receive the second positive transmission signal trs2_p and the second negative transmission signal trs2_n as the second transmission signal (corresponding to the second transmission signal trs2 of FIG. 1) in the differential scheme. The output unit 300 may output positive and is negative output signals out_p, out_n as an output signal (corresponding to the output signal out of FIG. 1). For example, the configuration and the operating method of the output unit 300 may be substantially similar to the configuration and the operating method of the output unit 300 shown in FIG. 3.

The receiver 10 shown in FIG. 5 may output the first positive input signal in1_p and the first negative input signal in1_n from among the received first positive input signal in1_p, first negative input signal in1_n and second input signal in2 as the positive output signal out_p and the negative output signal out_n when the first enable signal en1 is enabled and the second enable signal en2 is disabled.

In another example, the receiver 10 may output the second input signal in2 from among the received first positive input signal in1_p, first negative input signal in1_n and second input signal in2 as the positive output signal out_p and the negative output signal out_n having opposite phases when the first enable signal en1 is disabled and the second enable signal en2 is enabled.

Figure 6:
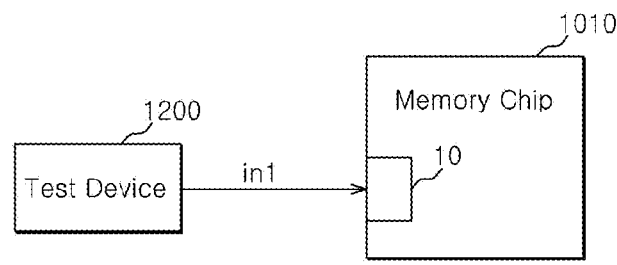
FIG. 6 is a block diagram representation of a memory chip including the receiver shown in FIG. 1 and a test device.

FIG. 6 is a block diagram representation of an example of a memory chip 1010 including the receiver 10 shown in FIG.

1 and a test device 1200. The memory chip 1010 is electrically coupled with the test device 1200 to be tested in the performance thereof.

The memory chip 1010 may be used to store data. For example, the memory chip 1010 may include an SRAM (static random access memory), a DRAM (dynamic random access memory), etc.

The memory chip 1010 may include first and second input signal terminals (not shown) for receiving signals from an external device. The memory chip 1010 may receive a first input signal in1 from the test device 1200 via the first input signal terminal. At this time, the memory chip 1010 may not receive any signal via the second input signal terminal. The receiver 10 may receive the first input signal in1 from the test device 1200 and a second input signal (for example, the second input signal in2 of FIG. 1) of a floating state. The receiver 10 may buffer the first input signal in1 and output the buffered first input signal as an output signal (corresponding to the output signal out of FIG. 1), without any significant influence or interference by the second input signal (for example, the second input signal in2 of FIG. 1) of the floating state. The receiver 10 may transmit the first input signal in1 to a circuit within the memory chip 1010.

Figure 7:
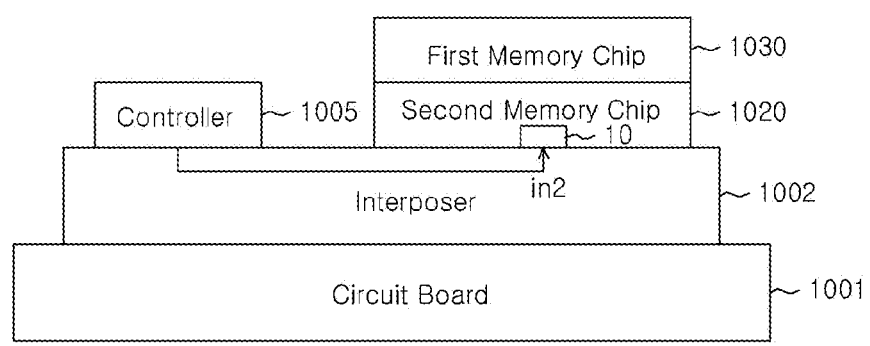
FIG. 7 is a front view of a semiconductor system including a first memory chip including the receiver shown in FIG. 1.

FIG. 7 is a front view of an example of a semiconductor system 1000 including a first memory chip 1020 including the receiver 10 shown in FIG. 1.

The semiconductor system 1000 may include a circuit board 1001, an interposer 1002, a controller 1005, the first memory chip 1020, and a second memory chip 1030.

The interposer 1002 may be disposed on the circuit board 1001. The controller 1005 may be disposed on the interposer 1002. The first memory chip 1020 may be disposed on the interposer 1002. The second memory chip 1030 may be stacked on the first memory chip 1020. While FIG. 7 shows two memory chips 1020, 1030 in a stacked configuration, it is to be noted that the number of memory chips is for an illustration purpose only.

The controller 1005 may control one or more operations of the first and second memory chips 1020, 1030 in response to a request from an external device. The controller 1005 may transmit signals to the first memory chip 1020 via the interposer 1002.

The first memory chip 1020 may be, for example, a logic memory chip. The first memory chip 1020 may control the operation of the second memory chip 1030 in accordance with a signal received from the controller 1005. The first memory chip 1020 may include a receiver 10 for transmitting a received signal to a circuit disposed within the first memory chip 1020.

The second memory chip 1030 may be, for example, a core memory chip. The second memory chip 1030 may store data that is write-requested from the external device, under the control of the first memory chip 1020.

The first memory chip 1020 may include first and second input signal terminals (not shown) for receiving signals from the controller 1005. The first memory chip 1020 may receive a second input signal in2 from the controller 1005 via the second input signal terminal. The first memory chip 1020 may not receive any signal via the first input signal terminal. In this case, the receiver 10 may receive the second input signal in2 from the controller 1005 and a first input signal (corresponding to the first input signal in1 of FIG. 1) is of a floating state. The receiver 10 may buffer the second input signal in2 and output the buffered second input signal as an output signal (corresponding to the output signal out of FIG. 1), without any significant influence or interference by the first input signal (for example, the first input signal in1 of FIG. 1) of the floating state. The receiver 10 may transmit the second input signal in2 to a circuit disposed within the first memory chip 1020.

An embodiment of the receiver of a semiconductor apparatus may transmit a received signal without significant influence or interference from other received signals when transmitting any one of a plurality of received signals is described herein.

While certain embodiments have been described above, it will be understood to those skilled in the art that the embodiments described are by way of example only. Accordingly, the receiver of a semiconductor apparatus and the semiconductor system including the same described herein should not be limited based on the described embodiments. Rather, the receiver of a semiconductor apparatus and the semiconductor system including the same described herein should only be limited in light of the claims that follow when taken in conjunction with the above description and accompanying drawings.

What is claimed is:

1. A receiver of a semiconductor apparatus, comprising:
a first buffer circuit configured to buffer a first positive input signal and a first negative input signal having a phase opposite the phase of the first positive input signal and to output the buffered first positive input signal as a first positive transmission signal and to output the buffered first negative input signal as a first negative transmission signal in a first period in response to a first enable signal;
a second buffer circuit configured to buffer a second positive input signal and a second negative input signal having a phase opposite the phase of the second positive input signal and to output the buffered second positive input signal as a second positive transmission signal and to output the buffered second negative input signal as a second negative transmission signal in a second period in response to a second enable signal; and
an output circuit configured to invert one of the first and second positive transmission signals and to output the inverted one of the first and second positive transmission signals as a positive output signal, and to invert one of the first and second negative transmission signals and to output the inverted one of the first and second negative transmission signals as a negative output signal,
wherein the first period and the second period do not overlap with each other, and
wherein the first enable signal and the second enable signal are not enabled at a same time.

2. The receiver according to claim 1,
wherein the first buffer circuit is configured to output the first positive transmission signal and the first negative transmission signal at a first logic level when the first enable signal is disabled, and
wherein the second buffer circuit is configured to output the second positive transmission signal and the second negative transmission signal at the first logic level when the second enable signal is disabled.

3. The receiver according to claim 2, wherein, when one of the first and second positive transmission signals is at the first logic level, the output circuit is configured to invert the other one of the first and second positive transmission signals, and when one of the first and second negative transmission signals is at the first logic level, the output circuit is configured to invert the other one of the first and second negative transmission signals.

4. The receiver according to claim 1,
wherein the first buffer circuit is configured to receive the first positive input signal and the first negative input signal from an external device, and
wherein the second buffer circuit is configured to receive the second positive input signal and the second negative input signal in a floating state.

5. A receiver of a semiconductor apparatus, comprising:
a first buffer circuit configured to buffer a first input signal and to output a first positive transmission signal and a first negative transmission signal having a phase opposite the phase of the first positive transmission signal in response to a first enable signal;
a second buffer circuit configured to buffer a second input signal and to output a second positive transmission signal and a second negative transmission signal having a phase opposite the phase of the second positive transmission signal in response to a second enable signal; and
an output circuit configured to invert one of the first and second positive transmission signals and to output the inverted one of the first and second positive transmission signals as a positive output signal, and to invert one of the first and second negative transmission signals and to output the inverted one of the first and second negative transmission signals as a negative output signal,
wherein the first buffer circuit comprises:
an amplifying section configured to invert the first input signal and to output the inverted first input signal as an amplified signal in response to the first enable signal; and
a dividing section configured to divide the amplified signal and to output the positive transmission signal and the first negative transmission signal in response to the first enable signal.

6. The receiver according to claim 5,
wherein the first buffer circuit is configured to output the first positive transmission signal and the first negative transmission signal at a first logic level when the first enable signal is disabled, and
wherein the second buffer circuit is configured to output the second positive transmission signal and the second negative transmission signal at the first logic level when the second enable signal is disabled.

7. The receiver according to claim 6, wherein, when one of the first and second positive transmission signals is at the first logic level, the output circuit is configured to invert the other one of the first and second positive transmission signals, and when one of the first and second negative transmission signals is at the first logic level, the output circuit is configured to invert the other one of the first and second negative transmission signals.

8. The receiver according to claim 5,
wherein the first buffer circuit is configured to receive the first input signal from an external device, and
wherein the second buffer circuit is configured to receive the second input signal in a floating state.

9. A receiver of a semiconductor apparatus, comprising:
a first buffer circuit configured to buffer a first positive input signal and a first negative input signal having a phase opposite the phase of the first positive input signal and to output the buffered first positive input signal as a first positive transmission signal and to out put the buffered first negative input signal as a first negative transmission signal in response to a first enable signal;
a second buffer circuit configured to buffer a second input signal and to output a second positive transmission signal and a second negative transmission signal having a phase opposite the phase of the second positive transmission signal in response to a second enable signal; and
an output circuit configured to invert one of the first and second positive transmission signals and to output the inverted one of the first and second positive transmission signals as a positive output signal, and to invert one of the first and second negative transmission signals and to output the inverted one of the first and second negative transmission signals as a negative output signal,
wherein the second buffer circuit comprises:
an amplifying section configured to invert the second input signal and to output the inverted first input signal as an amplified signal in response to the second enable signal; and
a dividing section configured to divide the amplified signal and to output the second positive transmission signal and the second negative transmission signal in response to the second enable signal.

10. The receiver according to claim 9,
wherein the first buffer circuit is configured to output the first positive transmission signal and the first negative transmission signal at a first logic level when the first enable signal is disabled, and
wherein the second buffer circuit is configured to output the second positive transmission signal and the second negative transmission signal at the first logic level when the second enable signal is disabled.

11. The receiver according to claim 10, wherein when one of the first and second positive transmission signals is at the first logic level the output circuit is configured to invert the other one of the first and second positive transmission signals, and when one of the first and second negative transmission signals is at the first logic level the output circuit is configured to invert the other one of the first and second negative transmission signals.

12. The receiver according to claim 9,
wherein, when the first buffer circuit receives the first positive input signal and the first negative input signal from an external device and the second buffer circuit receives the second input signal in a floating state the first enable signal is enabled, and
wherein, when the second buffer circuit receives the second input signal from an external device and the first buffer circuit receives the first positive input signal and the first negative input signal in a floating state the second enable signal is enabled.

13. A semiconductor system comprising:
a memory chip including a receiver; and
a controller configured to control at least one operation of the memory chip in response to a request received from an external device,
wherein the memory chip is configured to receive a second input signal in a floating state when receiving a first input signal from to an external device, and is configured to receive the first input signal in a floating state when receiving the second input signal from the controller,
the receiver comprising:
a first buffer circuit configured to buffer the first input signal and to output the buffered first input signal as a first transmission signal in a first period in response to a first enable signal;
a second buffer circuit configured to buffer the second input signal and to output the buffered second input signal as a second transmission signal in a second period in response to a second enable signal; and an output circuit configured to invert one of the first and second transmission signals and to output the inverted one of the first and second transmission signals as an output signal, wherein the first period and the second period do not overlap with each other, and wherein the first enable signal and the second enable signal are not enabled at a same time.

14. The semiconductor system according to claim 13, wherein the first buffer circuit is configured to output the first transmission signal at a first logic level when the first enable signal is disabled, and wherein the second buffer circuit is configured to output the second transmission signal at the first logic level when the second enable signal is disabled.

15. The semiconductor system according to claim 14, wherein, when one of the first and second transmission signals is at the first logic level, the output circuit is configured to invert the other to one of the first and second transmission signals.

* * * * *